(12) United States Patent
Sarayeddine et al.

(10) Patent No.: US 7,612,771 B2
(45) Date of Patent: Nov. 3, 2009

(54) IMAGE PROJECTION SYSTEM COMPRISING A SINGLE IMAGER WHICH IS EQUIPPED WITH PHOTOSENSITIVE SENSORS FOR THE IDENTIFICATION OF ILLUMINATION COLOURS

(75) Inventors: Khaled Sarayeddine, Nouvoitou (FR); Laurent Blonde, Thorigné-Fouillard (FR)

(73) Assignee: Thomson Licensing, Boulogne-Billancourt (FR)

( * ) Notice: Subject to any disclaimer, the term of this patent is extended or adjusted under 35 U.S.C. 154(b) by 200 days.

(21) Appl. No.: 10/541,634

(22) PCT Filed: Jan. 5, 2004

(86) PCT No.: PCT/EP2004/050003

§ 371 (c)(1),
(2), (4) Date: Apr. 11, 2006

(87) PCT Pub. No.: WO2004/062294

PCT Pub. Date: Jul. 22, 2004

(65) Prior Publication Data

US 2006/0208987 A1 Sep. 21, 2006

(30) Foreign Application Priority Data

Jan. 7, 2003 (FR) .................................. 03 00228

(51) Int. Cl.
*G06F 3/038* (2006.01)
*G09G 5/00* (2006.01)

(52) U.S. Cl. ...................... 345/207; 345/102; 345/88; 348/742; 348/796

(58) Field of Classification Search ............... 345/207, 345/98, 87, 88, 102
See application file for complete search history.

(56) References Cited

U.S. PATENT DOCUMENTS

| 5,416,514 | A | 5/1995 | Janssen et al. | |
|---|---|---|---|---|
| 6,084,235 | A | 7/2000 | Breithaupt et al. | |
| 6,121,950 | A | 9/2000 | Zavracky et al. | |
| 6,803,902 | B2 * | 10/2004 | Janssen et al. | 345/102 |
| 6,950,088 | B2 * | 9/2005 | Dalal | 345/102 |
| 6,952,241 | B2 * | 10/2005 | Ouchi et al. | 348/742 |
| 2002/0149749 | A1 | 10/2002 | Janssen | |

FOREIGN PATENT DOCUMENTS

EP 1199896 4/2002

OTHER PUBLICATIONS

Search Report Dated Aug. 2, 2004.

* cited by examiner

*Primary Examiner*—Amare Mengistu
*Assistant Examiner*—Robert R Rainey
(74) *Attorney, Agent, or Firm*—Robert D. Shedd; Harvey D. Fried; Richard LaPeruta

(57) ABSTRACT

An image projection system has an illumination system for moving bands of different colored light over the light valve. The image projection system identifies the illumination color of each row of pixels of this light valve, manages the video data of the images to control the writing of the pixels, synchronizes the video data sent to each row of pixels according to the identified illumination color of the row. At least one photosensitive sensor is level with certain rows of pixels of the light valve, is incorporated in the substrate and is designed to identify in real time the illumination color of each row.

3 Claims, 4 Drawing Sheets

Figure 1:
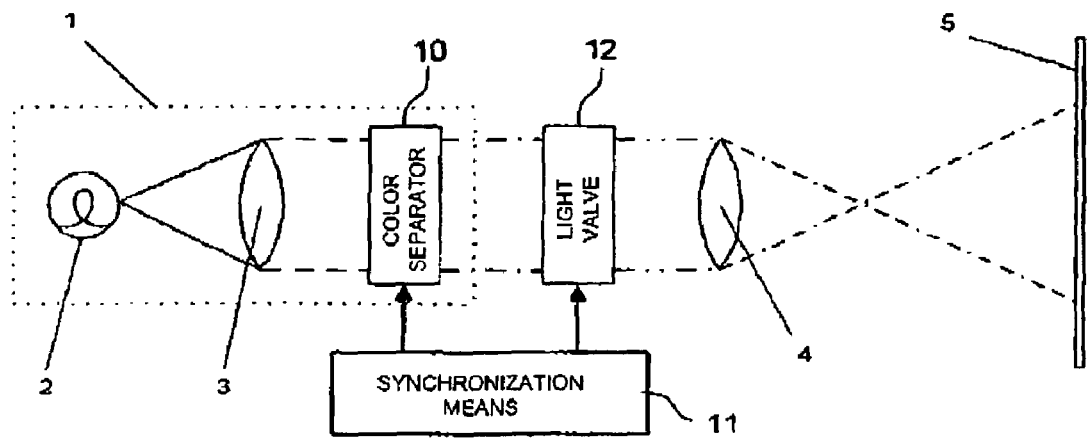

IMAGE PROJECTION SYSTEM COMPRISING A SINGLE IMAGER WHICH IS EQUIPPED WITH PHOTOSENSITIVE SENSORS FOR THE IDENTIFICATION OF ILLUMINATION COLOURS

This application claims the benefit, under 35 U.S.C. § 365 of International Application PCT/EP04/050003, filed Jan. 5, 2004, which was published in accordance with PCT Article 21(2) on Jul. 22, 2004 in French and which claims the benefit of French patent application No. 0300228, filed Jan. 7, 2003.

The invention relates to image projection systems and/or image display systems comprising a light valve or spatial light modulator (SPL), comprising a pixel matrix array, for example liquid crystal on silicon substrate (LCOS), digital micro-mirror device/display (DMD), or high temperature polysilicon (HTPS), disposed in rows and in columns on a substrate forming an active matrix, mainly of silicon, an illumination system of this light valve for moving bands of different colored light, or "color scrolling", over the light valve perpendicularly to said rows, means for identifying the illumination color on each row or on each group of rows of pixels of the light valve, means of managing video data of said images for controlling the writing of the pixels of the light valve, means of synchronizing the video data sent to each row of the light valve according to the illumination color of said row identified by said identification means.

The image projection systems, commonly called projectors or back projectors according to whether the projection is from the front of the screen for projectors or from the back for back projectors, operate according to the same principle. An illumination system uniformly lights one or more light valves, the light is modulated after passing through the light valve(s) in the case of the transmissive light valves or after reflection on the light valve(s) in the case of the reflective light valves. The duly modulated light is then projected onto a screen.

For some years now, the trend has been towards single-light-valve, or single-valve, transmissive or reflective type image projection systems, that are smaller, offer a lower light efficiency but are less expensive than the multiple-light-valve image projection systems.

To generate color images, the projection systems of this type sequentially display images of different colors on the screen, normally the three primary colors red, green and blue (RGB), fast enough for the human eye not to perceive the changes of color on the screen. These image projection systems normally comprise illumination devices for illuminating the single light valve of an alternately red, green and blue light by the use of color wheels, or partially red, green and blue at the same time in the form of light bands by "color scrolling", and scrolling perpendicularly to the rows of the pixel array of the light valve, by the use of systems that are described briefly below. The video data controlling the writing of the pixels must then be synchronized according to the color that each pixel receives in order to form an image that is free of defects for the viewer such as an inappropriate mix of colors or a lowering of the contrasts of the image on the screen.

In these systems, the synchronization between the illumination system and the video data controlling the writing of the pixels of the light valve is handled by synchronization means that on the one hand measure a position signal of the element of the illumination system originating the scrolling of the different colored light bands on the light valve to inform said synchronization means of the illumination color of the light sent to each pixel of the light valve by the color wheel or the illumination system, and on the other hand control the writing of the pixels according to said measured signal. This synchronization is relatively easy if the light valve is illuminated alternately by a red, green and blue light, by the use of the color wheel, for example, but it becomes more complicated when the illumination of the light valve, or to be more precise, the color of the incident light on the light valve, is made up of said bands of different colored light and varies according to the rows of pixels of the light valve. In particular, in order to safeguard against the bleeding of colors into each other (crosstalk), which causes a deterioration of the quality of the image and in particular a loss of contrast, the synchronization means are normally programmed with safety margins in the generation of the video data.

The document U.S. Pat. No. 5,416,514 describes a projection system with a transmissive light valve comprising an illumination system (references 10, 12, 14, 16 in FIG. 1 of the document) separating the white light from a light source into bands of different colored light by the use of a dichroic mirror device (reference 12 in FIG. 1 of the document). After passing through an assembly of rotating prisms moved by a motor (reference 14 in FIG. 1 of the document) and lenses (reference 16 in FIG. 1 of the document), rectangular bands of different colors scroll over the light valve (reference 18 in FIG. 1 of the document) alternately. In this document, and in reference to FIG. 6, the video data (reference 112) from a video source (reference 110) is sent to a video memory (reference 114) and controlled by a control circuit (reference 140) which receives a synchronization signal SYNC (reference 118) from the video source (reference 112). The video data output from the video memory (reference 114) is then sent for writing to the light valve (reference 122). A second control circuit (reference 142), linked to the first control circuit (reference 140) for receiving in particular the synchronization signal SYNC (reference 118), controls the reading (reference 130) of the video memory (reference 114) and the writing (reference 132) of the pixels of the light valve (reference 122). The motor (reference 125), actuating the rotation of the prisms rotating in the illumination system (reference 124), is locked onto the second control circuit (reference 142) to obtain the rotation of the prisms rotating in accordance with the synchronization signal SYNC (reference 118), so leading to a scrolling of the different color light bands over the light valve in synchronization with the video data controlling the writing of the optical valves. The control circuit (reference 142) also receives signals in real time on the position, or phase, of the rotating prism assembly from a position encoder (reference 127) incorporated in the illumination system. For each position, or phase, of the rotating prism assembly there is a corresponding unique position on the light valve of the different color light bands, and the position encoder (reference 127), which supplies this position, or phase, signal, here constitutes a means of identification of the illumination color of each row of the light valve.

The means of identifying the illumination color of each row of pixels comprising the device for measuring the instantaneous position of the rotating prism assembly does however have the drawback of relying on the measurement of an assembly of high-inertia mechanical elements, the prisms, which is liable, with time and the rotation stresses to which it is subject, to become misadjusted and introduce an offset, however slight, between the measurement of the position of the rotating prism assembly presumed to inform the synchronization means of the illumination color of the light sent to each pixel of the light valve, and the real position of the different color light bands on the pixel array of the light valve. This offset then leads to defects of synchronization, color mix and a loss of contrasts as stated previously.

One of the critical points is the mechanical assembly of the rotating prism device. A rectangular slot, located in front of each rotating prism, is normally imaged on the screen. Its position, in particular in the vertical plane of the light valve is critical, and its rotation can lead to errors that the prism synchronization system cannot detect.

In the case of an illumination system in which a color wheel is used with helical red, green and blue bands (otherwise known as a scrolling color wheel, SCR) introduced in the Texas Instrument patent EP1098536, adjustment and fabrication tolerances make the synchronization of the scrolling of the light bands on the light valve and the video data difficult. Furthermore, the bands scrolling on the light valve are slightly curved, which is not the case with the use of rotating prisms or a rotating drum.

The documents E1199896—HITACHI—and US2002/0149749—PHILIPS—describe projection systems with scrolling of different color bands on the light valve, which present the same risks of error on the identification of the illumination color; no photosensitive sensor is used in these systems to identify the illumination color directly or indirectly at each instant.

One object of the invention is to avoid the abovementioned problems.

To this end, the invention relates to an image projection system comprising a light valve comprising a pixel matrix array disposed in rows and columns on a substrate forming an active matrix, an illumination system for moving bands of different colored light over the light valve, perpendicularly to said rows, means for identifying the illumination color of each row of pixels of the light valve, means of managing video data of said light valves for controlling the writing of said pixels of the light valve, means of synchronizing the video data sent to each row of pixels of the light valve according to the illumination color of said row identified by said identification means, characterized in that the identification means comprise at least one photosensitive sensor disposed level with said pixels of the light valve.

According to a variant of the invention, each sensor is disposed level with a row of pixels of the light valve, and there are fewer sensors than there are rows of pixels, and the projection system comprises calculation means for deducing the illumination color of the rows of pixels that are not provided with a sensor according to data delivered by said sensors.

This variant will now be described in the particular case in which the light valve is provided only with a single photosensitive sensor as the means of identifying the illumination color of each row of pixels of the light valve: in practice, this single sensor is, for example, positioned on the light valve level with a specific row of pixels; this single sensor is designed to identify the illumination color of the pixels of this row.

According to this single-sensor variant, the projection system comprises calculation means designed to deduce, from the illumination color of the pixels of this specific row of pixels, the illumination color of each row of pixels of the light valve. These calculation means incorporate data relating to the width of the color bands illuminating the light valve, where appropriate, the width of black bands interposed between the color bands, and/or the speed of movement of the bands perpendicularly to the rows.

The illumination color of each row of pixels of the light valve can be identified as follows:

during the movement of the color bands, the photosensitive sensor notes the instant of each change or transition of color band at the level of the specific row of pixels; this data is transmitted to the calculation means, which, in a known manner, deduces from it a given position of the color bands on the light valve at that instant, from the time interval that elapses between two successive changes, the calculation means deduce the speed of movement of the color bands, from the transition instants, from the position of the color bands at these instants, and from the speed of movement of the bands, the calculation means calculate the position of the color bands at each instant and, from this, deduce the illumination color of each row of pixels of the light valve at each instant.

The same variant is applied in the case where the light valve is provided with a plurality of sensors, each positioned level with a row of pixels, the number of sensors being less the number of rows: each sensor is used to identify directly the illumination color of the row of pixels with which it is associated and can be used to identify indirectly, using the calculation means described previously, the illumination color of the rows of pixels that are not provided with sensors.

Preferably, in the projection system according to the invention, the identification means comprise at least one photosensitive sensor level with each row of pixels of the light valve (12) and each sensor of a row is designed to identify the illumination color of that row. This then avoids the abovementioned calculation means and a more reliable and precise identification of the illumination colors of each row of pixels is obtained.

The photosensitive sensor of each row of pixels of the light valve thus identifies directly or "a posteriori", in real time and reliably, the color of the light actually received by each pixel of one and the same row, and not indirectly as in the case of a single sensor for all of the light valve, or "a priori" as described in the prior art. The direct identification of the illumination color results in a better synchronization of the video data controlling the writing of the pixels of the light valve with the true identified illumination color. The synchronization, performed for each row of pixels in turn, in particular allows the use of sophisticated illumination systems producing, for example, a scrolling of different color light bands, or "color scrolling", without requiring complex processing of the video data. This means that each pixel of one and the same row can be written as early as possible, and therefore the safety margins programmed in certain synchronization means for processing the video data and preserving the purity of the colors can be reduced. The result is an overall gain in brightness.

According to a preferred embodiment, the photosensitive sensor positioned level with the pixels of the light valve or each row of pixels of the light valve is incorporated in the substrate, normally silicon, of the light valve.

The photosensitive sensor(s) should be illuminated at the place where the light beam still has the same characteristics as the useful light beam illuminating the active area of the light valve. The logic circuits controlling the rows and columns of pixels of the light valve are normally etched on the substrate, so each photosensitive sensor advantageously has a circuit etched on the same substrate as that supporting the pixels of the light valve. Furthermore, the integration of the photosensitive sensors in the substrate is advantageously performed during the light valve fabrication process without significantly increasing either the size of the component or the production costs, given that there is sufficient space on the substrate of the light valve to include on it the photosensitive sensors and their connectors with the other circuits of the light valve, and given that the control circuits and these sensors can be formed by similar technologies.

According to a characteristic, said photosensitive sensor is designed to measure the illumination intensity received by the row of pixels of the light valve at the level of which it is positioned. The modulation of the light by the light valve to form the images is normally performed according to three principles. A first principle is the attenuation of the light for a fixed period, the second is the modulation of the period without the light being attenuated, and the third is the generation of pulses of variable durations similar to a binary code. Knowing the intensity of the illumination light makes it possible to optimize the adjustment, depending on the case, of the attenuation value, the pulse duration or the code generated, and to restore the colors with greater accuracy. Light flicker phenomena are generally induced by the light source and produce spurious variations of the light intensity on the light valve. The photosensitive sensors perceive these low frequency beat phenomena and send the corresponding signals to the video data management means which then advantageously correct the writing of the pixels of the light valve so as to compensate for these phenomena. Since the wear of the light source contributes to increasing the flicker phenomena over time, the presence of photosensitive sensors on the light valve advantageously preserves quality images throughout the life of the source.

Preferably, said at least one photosensitive sensor positioned level with each row of optical valves of the light valve is associated with a colored filter. The colored filter associated with the photosensitive sensor is used on the one hand for precise identification of the color of the light received, in this instance the same color as that of the colored filter, and on the other hand to measure the light intensity of said colored light illuminating the row of pixels level with which the photosensitive sensor is positioned. A configuration comprising at least three photosensitive sensors level with each row of pixels of the light valve, each associated with a different color filter, for example RGB, can advantageously be used to precisely identify the three primary colors RGB of the light bands received by each row of pixels and measure their light intensity in real time. This way, the time variation and the level of each of the three RGB signals are used to adjust and synchronize the video data for the three colors.

Preferably, said colored filter associated with the photosensitive sensor of each row of pixels of the light valve forms a continuous band associated with the set of photosensitive sensors of each row of pixels of the light valve responsible for identifying a particular color, for example red, green or blue. The colored filter thus forms a colored band that is simple to produce, that is arranged, for example, by multilayer deposition or deposition of absorbent layers etched on the glass plate covering the light valve, facing the row of the or each photosensitive sensor located level with each row of pixels of the light valve.

Figure 2:
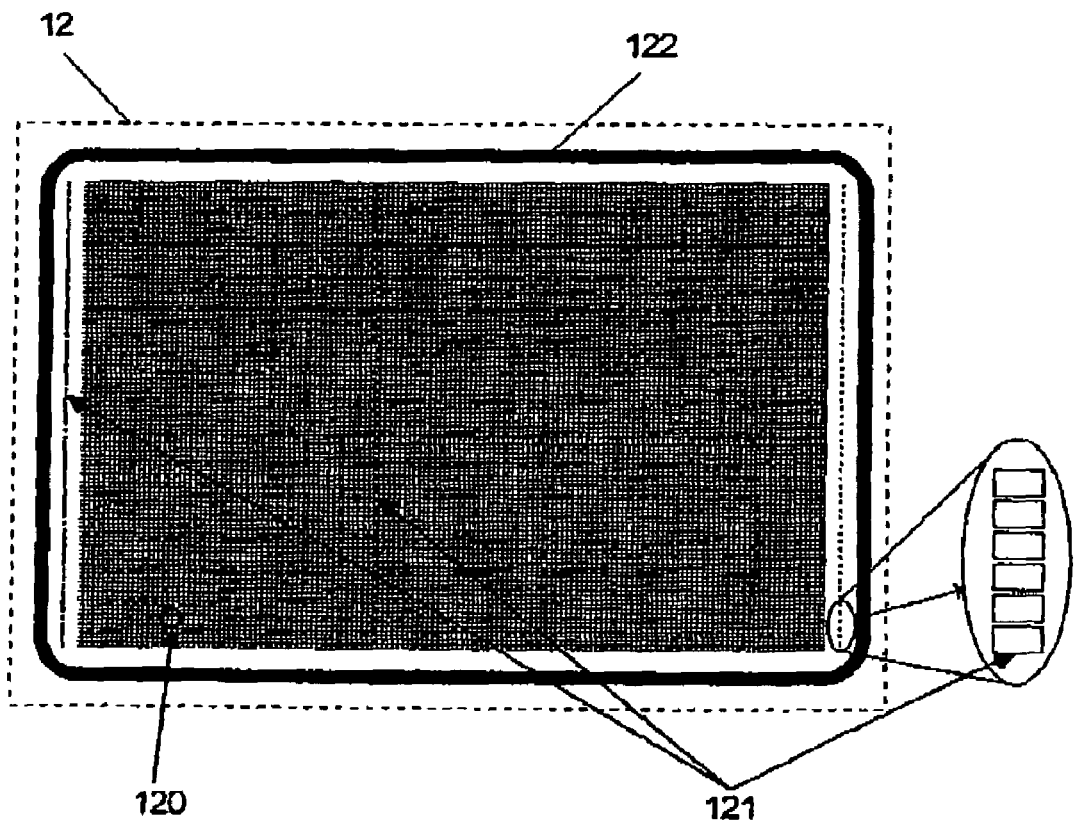
Figure 3:
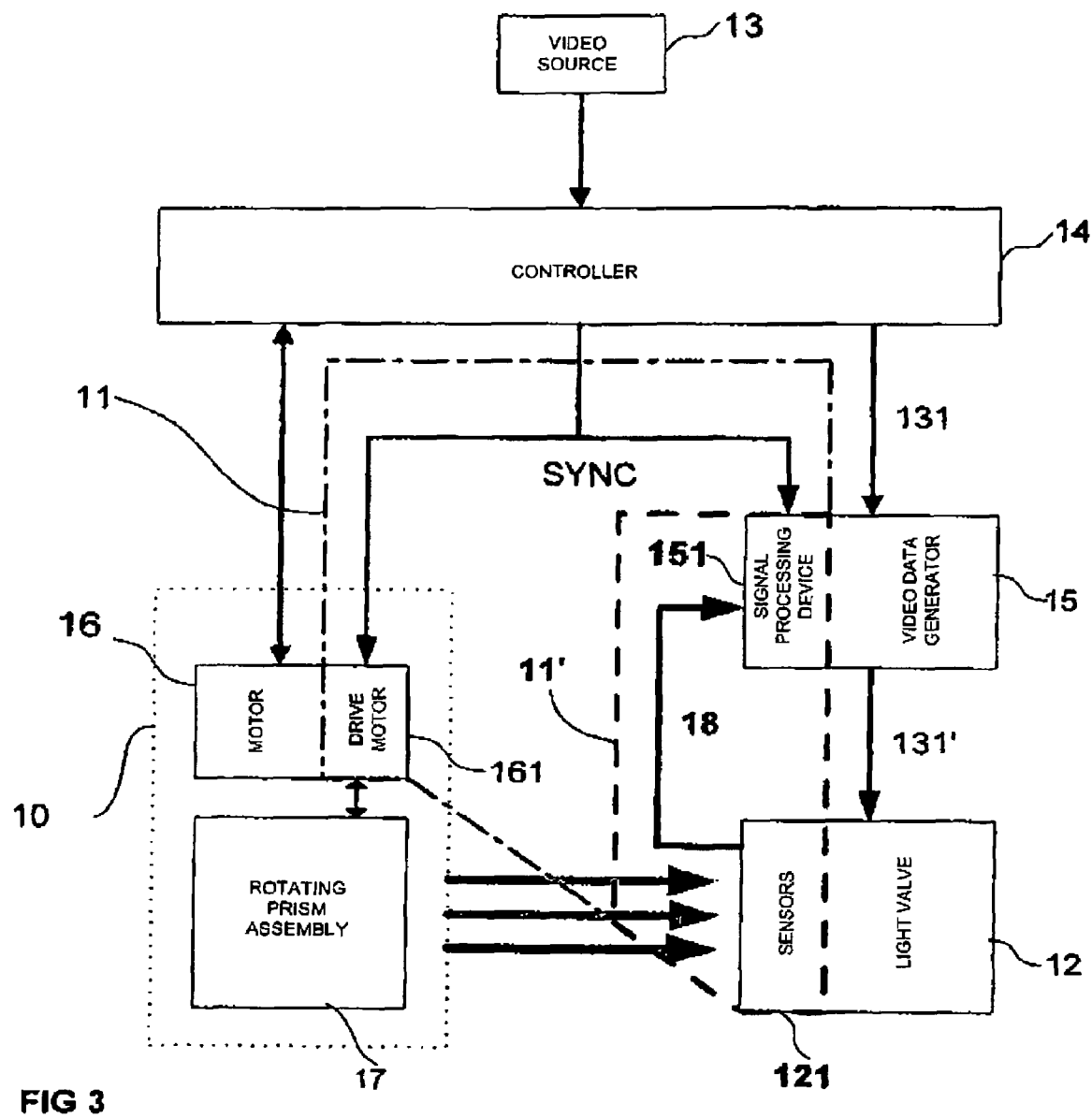
Figure 4:
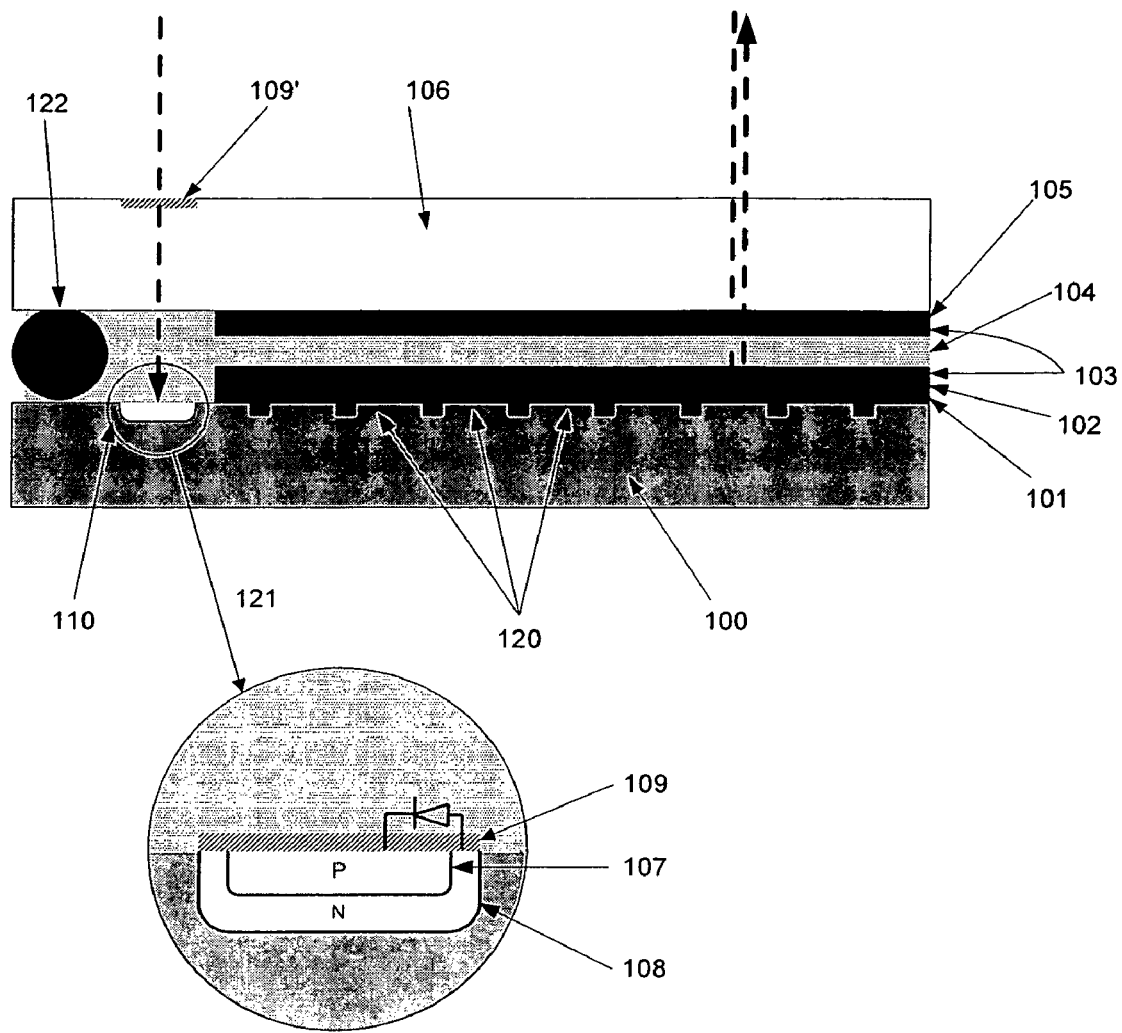
Figure 5:
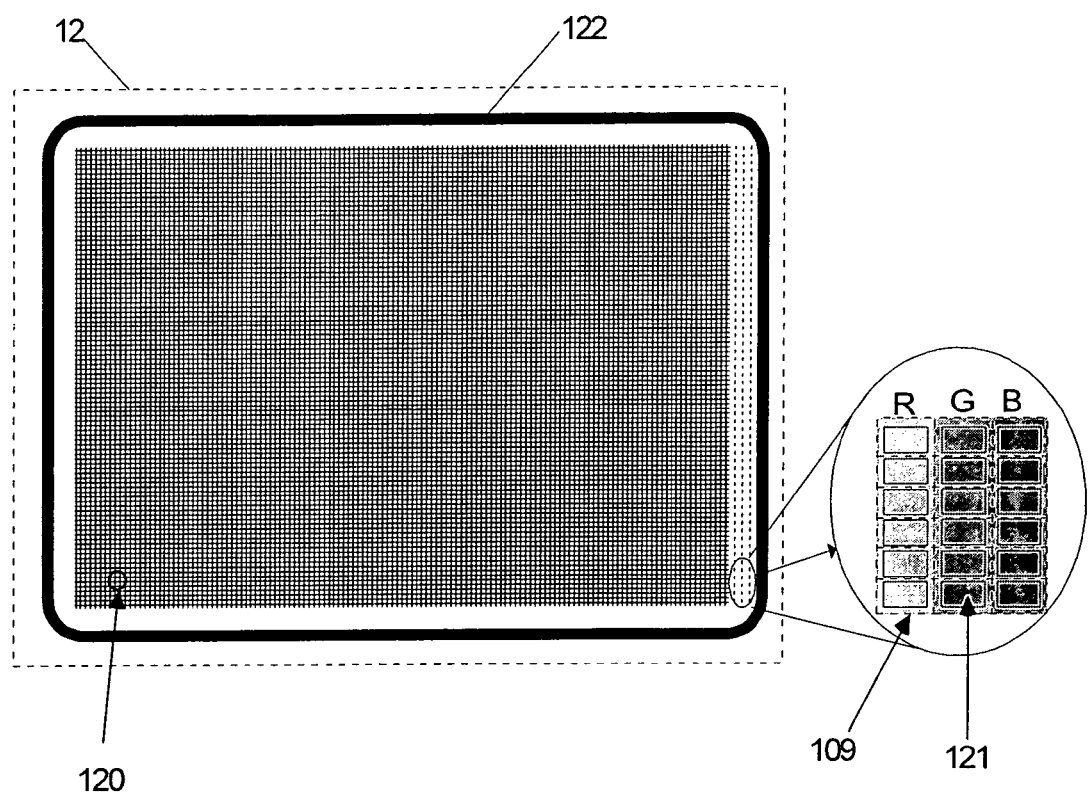

The invention will be better understood on reading the description that follows, given by way of nonlimiting example, and with reference to the appended figures in which:

FIG. 1 diagrammatically represents the main elements of a single-valve image projection system;

FIG. 2 presents a light valve, for example of LCOS type, comprising, according to a preferred embodiment of the invention, at least one photosensitive sensor for each row of pixels;

FIG. 3 presents a diagram describing the means of synchronizing video data for synchronizing the video data with the illumination color on the light valve according to the invention;

FIG. 4 describes the transverse cross section through a row of pixels on one side of an LCOS type light valve 12, according to the preferred embodiment of the invention, at least one photosensitive sensor 121 level with each row of pixels 120 according to the invention;

FIG. 5 presents a light valve, for example of LCOS type, comprising three photosensitive sensors for each row of pixels according to a variant of the preferred embodiment of the invention.

In order to simplify the description and disclose the differences and advantages presented by the invention compared to the prior art, identical references are used for those elements that provide the same functions.

A single-valve projection system is diagrammatically represented in FIG. 1. The system comprises an illumination system 1 mainly comprising a light source 2 which sends light to a device 10 responsible for separating the light into different color light beams, for example in different color light bands, through an intermediate optical device 3, normally a collimation device. In this respect, there are different devices for forming on the single light valve scrolling colored light bands, red, green and blue for example, in particular by the use of helical filtered color wheels, described in Texas Instruments patent EP1098536, or by the use of rotating prism devices described for example in the paper by Matthew S. Brennesholtz, SID Information Display, pages 20 to 22, July 2002 or Philips U.S. Pat. No. 6,097,352. Another type of device for illuminating the light valve with different color light bands consists in sending the light from the light source on oscillating colored filter bands as described in Olympus patent JP60-053901. These different devices will not be described further.

The light from an illumination system 1 illuminates a transmissive or reflective light valve 12 comprising a pixel array, the writing of which is managed by a video data generator, not shown here, mainly associated with synchronization means 11 for synchronizing the light from the pixel illumination system with the video data from the video data generator or, conversely, for synchronizing the video data controlling the writing of the pixels of the light valve 12 to modulate the incident light, according to the illumination color of the light on these valves. After transmission, or reflection, on the light valve 12, the duly modulated light is projected onto a screen 5 via an optical device 4. The devices 3 and 4, and the light source 2, are known per se and will not be described further.

FIG. 2 shows a light valve 12 comprising, according to a preferred embodiment of the invention, at least one photosensitive sensor 121 level with each row of pixels 120. The light valve 12 comprises a pixel matrix array 120, for example of the liquid crystal on silicon (LCOS) type or of the digital micromirror device (DMD) type, the writing of which is controlled by the video data generator and the synchronization means not shown in FIG. 2. The or each photosensitive sensor 121 is incorporated in the substrate of the light valve 12, for example on the silicon substrate in the case of an LCOS type light valve. According to a first embodiment, a single photosensitive sensor 121 without colored filter is incorporated in the substrate 100 level with each row of pixels 120 of the light valve 12, all of these sensors 121 then forming, for example, a column of sensors 121. When one of these photosensitive sensors 121 is illuminated, like the row of pixels with which it is associated, by a colored light band, it transmits a signal corresponding to the perceived illumination color. The signal will be different if the illumination color changes. This signal difference is enough to identify, in the video data generator, the illumination color on each row of pixels 120 of the light valve 12. According to a variant of this embodiment, a photosensitive sensor 121 is incorporated in the substrate of the light valve on either side of each row of the pixel array of the light valve 12, in order to have a more reliable and symmetrical measurement of the received illumination.

According to a variant that will now be described, three photosensitive sensors 121' are incorporated level with each row of pixels 120. According to other embodiments, the photosensitive sensors 121 are incorporated in the substrate of the light valve 12 within the very pixel array 120 of the light valve 12, or on the substrate of the transparent plate, normally of glass, receiving the counter-electrode.

With reference to FIG. 3, there now follows a description of the synchronization means 11 of a projection system comprising a rotating prism type illumination system. A video source 13 supplying mainly a video stream and a synchronization signal SYNC is linked to a controller 14 responsible on the one hand for transmitting the video data 131 to a video data generator 15 and on the other hand for driving the mechanical part of the colored band formation device 10. The colored band formation device 10 comprises, for example, a rotating prism assembly 17 and, in particular in its mechanical part, a locked motor 16 for rotating the rotating prisms. The controller 14 is also responsible for synchronizing "a priori", in particular using the synchronization signal SYNC, the generation of the video data 131' in the generator 15, before writing the pixels 120 of the light valve 12, and the angular position of the rotating prism assembly 17 via a locking device of the drive motor 161. Such synchronization is known in the prior art, in particular in Philips document U.S. Pat. No. 5,416,514 (columns 7 and 8).

According to the invention, each photosensitive sensor 121 level with the light valve 12 is, like the row of pixels 120 with which it is associated, illuminated by the moving colored light bands, which are projected on the light valve via the rotating prism assembly 17, and transmits in real time a signal 18 corresponding to the perceived illumination color to a signal processing device 151 in the video data generator 15 for identification. The illumination color is determined, for example in the video data generator 15, by analyzing the received signal level, by knowing a priori the spectral composition of the light for each of the red, green or blue states, and the spectral response of the photosensitive sensor 121. The video data generator 15 processes the information on color with the video data corresponding to it to control in real time the writing of the pixels 120 of each row of the light valve 12 for which the illumination color is thus directly identified. This "a posteriori" synchronization results from the direct identification of the illumination color on each row of pixels 120: it is performed in real time and is very accurate.

The identification of the illumination color on each row of pixels by the presence of the photosensitive sensors 121 according to the invention, and the "a posteriori" synchronization 11' associated with it, is used in particular, in the case of image projection systems using an "a priori" type synchronization as described previously, to correct, for example, the offsets or misadjustments which can occur in the mechanical part 16 of the illumination system 10.

According to a variant, the "a posteriori" synchronization means 11' according to the invention are sufficient in themselves to synchronize the video data 131 with the illumination color on the light valve 12; in the absence of a priori synchronization, the use of an inexpensive and non-locked drive motor 161 then becomes possible, so simplifying the illumination system 10.

With reference to FIG. 4, there now follows a description of the transverse cross section on one side of an LCOS type light valve 12 comprising, according to the preferred embodiment of the invention, at least one photosensitive sensor 121 level with each row of pixels 120 according to the invention. On a silicon substrate 100 on which are marked the logic control circuits of the component, there is deposited a layer of aluminum 101 and dielectric layers 102 for maximizing the reflectivity and insulating the circuits from incident radiation. Above, between two alignment layers 103, a space is provided of even thickness into which is inserted the liquid crystal 104, sealed above the second alignment layer 103 by a transparent plate 106, normally of glass, on which are disposed, on its face turned towards the substrate 100, fine transparent metal tracks 105 of indium tin oxide (ITO). Finally, around the periphery of the component, a seal 122 seals the substrate 100 and the transparent plate 106 to ensure a good seal tightness. According to the invention, the at least one photosensitive sensor 121 level with each row of pixels 120 is incorporated in the substrate 100 of the light valve by reserving on the substrate 100 a silicon area 110 without the metallization layer 101 and the other processes specific to the light valve that have been described briefly above. According to a variant, the set of silicon areas 110 reserved on the substrate form a band, vertical for example, within which are incorporated the photosensitive sensors 121 correctly aligned with the useful rows of pixels 120 of the light valve 12.

The substrate 100 of the light valve in this case, of LCOS type, is made of silicon, but the invention more generally concerns the incorporation of the set of photosensitive sensors 121 in substrates forming an active matrix. The invention is applied equally to DMD type light valves. FIG. 4 also describes a photosensitive sensor 121, for example of broad spectrum type made of silicon, level with each row of pixels 120. This type of sensor is used to detect a strong signal, the junction being formed by P 107 in N 108 chambers or vice versa. The sensor located at the periphery of the pixel array 120 should be lit by rays from the light beam that present the same characteristics as the useful beam lighting the active area of the LCOS 12, in other words, the pixel array 120. This light beam passes through the sheet of glass 106 covering the light valve, that is LCOS 12, the liquid crystal 104 and any transparent layers, for example the layers 102, improving the reflectivity.

An embodiment wherein a transistor is associated with the photosensitive sensor(s) constitutes an active device with "memory" for saving, for example, the information on the perceived illumination color and sending a signal to the signal processing device 151 in the video data generator 15 only when the illumination changes.

According to a variant, each photosensitive sensor 121 has associated with it a colored filter 109, for example red or green or blue. The simple configuration according to which a single photosensitive sensor 121, associated with a colored filter 109, is incorporated level with each row of pixels 120 of the light valve 12 provides for precise identification of a color, that of the colored filter 109 for example, and/or measurement of the light intensity of the light band. The precise identification, in real time, of a single illumination color is sufficient, in the case where the scrolling speed and the illumination area of each of the different color light bands are known or fixed, to determine, in the video data generator, the illumination color level with each row of pixels 120 of the light valve 12.

With reference to FIG. 5, a variant of the invention is presented which consists in incorporating in the substrate 100 three photosensitive sensors 121 level with each row of pixels 120, each of the sensors being associated with a colored filter 109 of different color, for example red, green and blue. In this configuration, the temporal variation and the level of each of the three signals, red, green and blue, are used in the video data generator to synchronize and adjust the video data for the three colors. A particular case of application for maximizing the use of the light stream for non-saturated images consists in replacing one or more of the three illumination colors R, G, B with a secondary color, yellow, magenta or cyan for example, or by a combination of primary and secondary colors. The video data generator, using the signal from the photosensitive sensors, best defines the writing of the pixels to correctly restore the original colors of the image.

The set of the colored filters of the same color associated with the photosensitive sensors forms, according to a variant of the invention, a colored band, for example vertical. These colored filters or bands associated with the photosensitive sensors are, with reference to FIG. 4, arranged in contact on the sensors (filter 109 in FIG. 4) or, according to a variant of the invention, inscribed on or in the transparent plate 106, facing the sensors with which they are associated (filter 109' in FIG. 4).

According to a variant of the embodiments described previously, the or each photosensitive sensor 121 is incorporated in the substrate of the light valve, on either side of each row of the pixel array of the light valve 12, in order to have a more reliable and symmetrical measurement of the received illumination.

Finally, without departing from the invention, any other type of photosensitive sensor can be used.

The invention applies also to the cases where the light valve is provided with only a single photosensitive sensor which is used, as described previously, for indirect identification of the illumination color of each row of pixels of the light valve.

The invention applies also to the intermediate cases in which the light valve is provided with a plurality of photosensitive sensors, but fewer than the number of rows of pixels, each associated with a row of pixels of the light valve, which are used not only for the direct identification of the illumination color of the rows of pixels with which they are associated, but also for the indirect identification of the illumination color of the other rows of pixels.

The invention claimed is:

1. An image projection system comprising:
   a light valve comprising a pixel matrix array disposed in rows and columns on a substrate forming an active matrix,
   an illumination system for moving bands of different colored light over the light valve, perpendicularly to said rows,
   means for identifying the illumination color of each row of pixels of the light valve,
   means of managing video data of said images for controlling the writing of said pixels of the light valve,
   means of synchronizing the video data sent to each row of pixels of the light valve according to the illumination color of said row identified by said identification means,
   wherein the identification means comprises at least one photosensitive sensor level with each row of said pixels of the light valve, each sensor of row being designed to identify directly the illumination color of that row and to measure the illumination intensity of that row, and
   wherein the measurement of the illumination intensity is used in the means of managing video data to adjust the video data and the colors of said images for controlling the writing of said pixels.

2. The image projection system as claimed in claim 1, wherein the or each photosensitive sensor of the light valve is incorporated in said substrate.

3. The image projection system as claimed in claim 1, wherein the or each photosensitive sensor is associated with a colored filter.

* * * * *

UNITED STATES PATENT AND TRADEMARK OFFICE
CERTIFICATE OF CORRECTION

PATENT NO. : 7,612,771 B2  Page 1 of 1
APPLICATION NO. : 10/541634
DATED : November 3, 2009
INVENTOR(S) : Sarayeddine et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 320 days.

Signed and Sealed this

Nineteenth Day of October, 2010

David J. Kappos
*Director of the United States Patent and Trademark Office*